United States Patent [19]

Stoll

[11] Patent Number: 5,604,081

[45] Date of Patent: Feb. 18, 1997

[54] METHOD FOR PRODUCING A SURFACE STRUCTURE WITH RELIEFS

[75] Inventor: Lothar Stoll, Munich, Germany

[73] Assignee: Siemens Aktiengesellschaft, Munich, Germany

[21] Appl. No.: 98,101

[22] Filed: Jul. 28, 1993

[30] Foreign Application Priority Data

Aug. 14, 1992 [DE] Germany .................. 42 27 044.8

[51] Int. Cl.$^6$ ...................................... G03C 5/00
[52] U.S. Cl. .................. 430/322; 430/323; 430/324; 430/325; 430/326; 430/394
[58] Field of Search ..................... 430/321, 323, 430/324, 322, 325, 326, 394

[56] References Cited

U.S. PATENT DOCUMENTS

| | | | |
|---|---|---|---|
| 3,875,026 | 4/1975 | Widmer | 204/27 |
| 4,343,890 | 8/1982 | Phillips et al. | 430/321 |
| 4,642,163 | 2/1987 | Greschner et al. | 156/643 |
| 4,842,969 | 6/1989 | Kawatsuki et al. | 430/321 |
| 4,857,383 | 8/1989 | Greschner et al. | 428/156 |
| 4,895,790 | 1/1990 | Swanson et al. | 430/323 |
| 5,213,916 | 5/1993 | Cronin et al. | 430/324 |
| 5,279,924 | 1/1994 | Sakai et al. | 430/321 |
| 5,434,026 | 7/1995 | Takatsu et al. | 430/394 |

FOREIGN PATENT DOCUMENTS

| | | |
|---|---|---|
| 0117258 | 9/1884 | European Pat. Off. . |
| 0140175 | 5/1985 | European Pat. Off. . |
| 0413365 | 2/1991 | European Pat. Off. . |
| 0523861 | 1/1993 | European Pat. Off. . |
| 63-08316 | 12/1988 | Japan . |

OTHER PUBLICATIONS

Abstract of Japanese 02–238636, *Patent Abstracts of Japan*, vol. 14, No. 553 (E–1010), 7 Dec. 1990.

Abstract of Japanese 62–001232, *Patent Abstracts of Japan*, vol. 11, No. 165 (E–510), 27 May 1987.

Webster's II New Riverside University Dictionary, p. 441.

Katzschner et al, "Reactive Ion Beam Etching of InP with $N_2$ and $N_2O_2$ Mixtures", *Appl. Phys. Lett.*, vol. 48, No. 3, 20 Jan. 1986, pp. 230–232.

*Primary Examiner*—Mark A. Chapman
*Attorney, Agent, or Firm*—Hill, Steadman & Simpson

[57] ABSTRACT

A method for producing relief surface structures comprises the step of providing a photoresist layer having a relief surface structure on a surface of a substrate, the relief structure of the photoresist layer being like the surface relief structure desired on the substrate, then removing the photoresist layer with an erosion process that erodes both the photoresist layer as well as the substrate material which is free of the photoresist layer or becomes free of the photoresist layer. To obtain the relief surface structure in the photoresist layer, the layer can be exposed with different amounts of exposure and then developed to form the relief structure

7 Claims, 3 Drawing Sheets

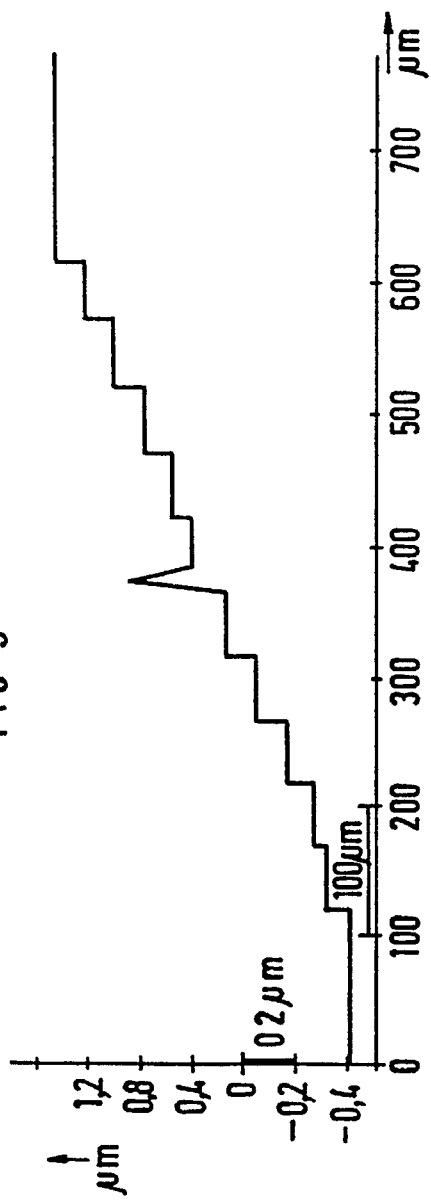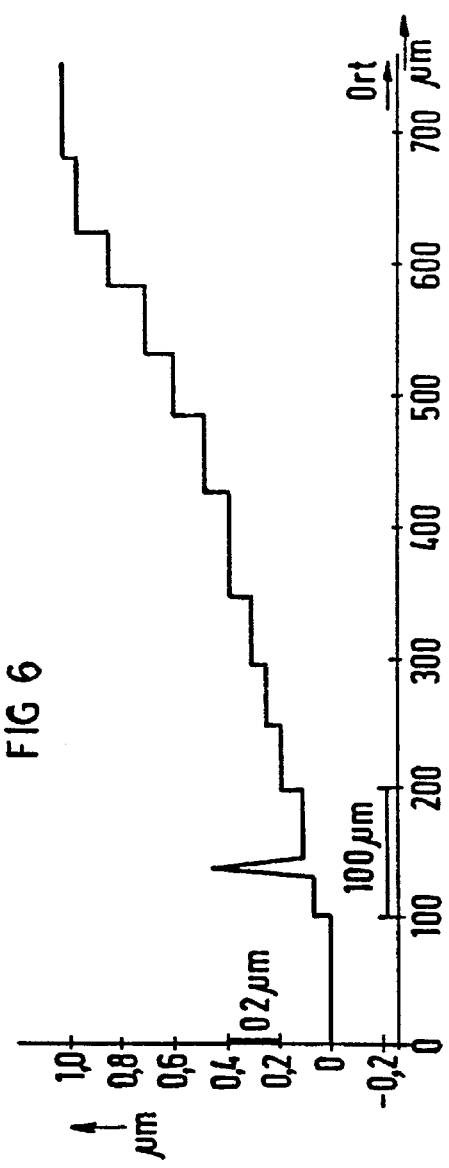

5,604,081

METHOD FOR PRODUCING A SURFACE STRUCTURE WITH RELIEFS

BACKGROUND OF THE INVENTION

The present invention is directed to a method for producing a relief surface structure on a surface of a substrate by utilizing an erosion or removing process.

Surface structures that are microscopically relief-like, for example three-dimensionally structured, are applied in many technical areas. Examples are in integrated optics to form optical layer-thickness tapers in optical waveguides, geodetic lenses or integrated microlenses. Another area is optical interconnects, for example, to form Fresnel lenses and to form integrated opto-electronics which, for example, have the form of flat transitions for optical waveguides between structural levels. The relief structure is also used in optical grating technology to form a blaze grating and the structure is used to form micromechanics.

Various methods were previously proposed or utilized for producing such three-dimensional structured surface structures. These include:

a) Sputtering on a structured etching mask in a shadow-casting technique and subsequently etching in a process that erodes both the mask as well as the material. There are difficulties in this method in view of the alignment or adjustment possibilities and in the influenceability of the taper form.

b) The multiple repetition of the process sequence of "lithography and etching". For example, this method can be employed for the manufacturing of a Fresnel lens or integrated microlenses, but is extremely time-intensive and only allows an extremely rough thickness graduation. Moreover, adjustment and alignment problems will occur.

c) Etching with an etching mask of a photoresist that was vertically rounded off by a hard bake. This method, for example, can be applied for the manufacturing of microlenses, but presents difficulties in view of the limited control of the vertical form due, for example, to boundary angles at the resist edge.

SUMMARY OF THE INVENTION

An object of the present invention is to provide a simple method for producing a relief surface structure which can be manufactured in a controlled fashion and with good reproducibility.

This object is obtained by a process or method of producing a relief surface structure comprising the steps of providing a photoresist layer on a substrate, said photoresist layer having a relief surface structure that is essentially identical to the relief surface structure to be produced on the surface of the substrate, and then performing an eroding or removing process to remove both the photoresist as well as any substrate material which is free of the photoresist or becomes free of the photoresist.

Preferably, the erosion process is an etching with a reactive ion beam etching process, particularly one utilizing $N_2$ and $O_2$ as etching gases.

Preferably, an advantageous method of manufacturing the photoresist layer with a relief-like surface structure employs a method of forming the relief structure in the photoresist by providing a photoresist layer having a uniform thickness, exposing the photoresist layer topically with different exposure doses and developing the resist after exposure. Obtaining the different exposure doses can be obtained by having the photoresist layer with a uniform field subjected to different exposure fields lying next to one another and being exposed with an exposure dose selected differently field-by-field or the same for each field. It is also possible that the uniform layer of the photoresist is exposed in different partially overlaid exposure fields with the exposure dose being selected identically or differently during each exposure.

Other advantages and features of the invention will be readily apparent from the following description of the preferred embodiments, the drawings and claims.

BRIEF DESCRIPTION OF THE DRAWINGS

FIG. 5 is a true to scale measurement of a multi-step resist thickness profile of a photoresist layer produced on an InP substrate on a colored positive photoresist having a step-like surface structure for the optical layer thickness taper; and FIG. 6 is a true to scale measured profile of the surface structure of the InP substrate obtained after removal of the photoresist layer of FIG. 5 with a reactive ion beam method to form the surface structure of a taper.

DESCRIPTION OF THE PREFERRED EMBODIMENTS

The principles of the present invention are particularly useful when incorporated in a method for producing a relief surface structure on a substrate which assumes a photoresist layer having a relief structure that is essentially identical to the relief structure to be produced on the substrate. The way of producing such a structured photoresist layer is basically of no significance for the actual method for producing the relief surface structure on the substrate. Any method that leads to such a structured photoresist layer is suitable.

Figure 1A:
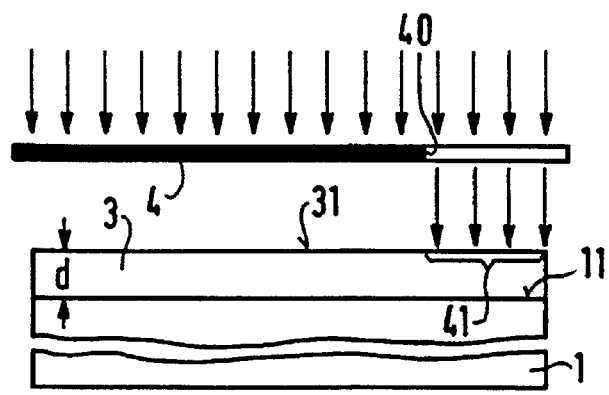
FIGS. 1a, 1b and 1c are schematic illustrations of the three exposure steps following one another for producing the exposure of a photoresist layer having a uniform layer of thickness with topically dependent exposure doses.
Figure 1B:
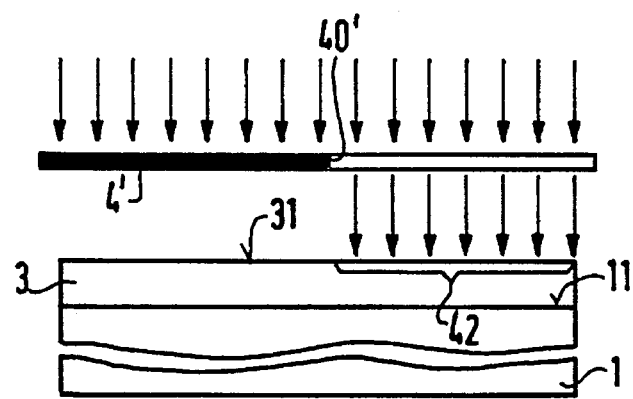
Figure 1C:
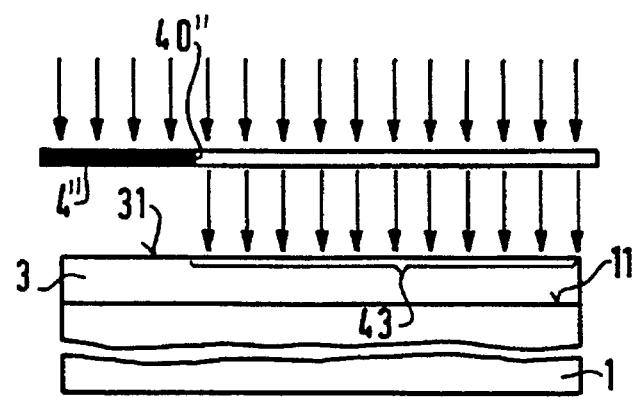

An especially simple and advantageous method for producing such a photoresist layer is set forth based on the example of a step-shaped surface structure that is suitable for the manufacture of optical layer-thickness tapers with reference to FIGS. 1a through 1c.

In FIG. 1a, a positive-type photoresist layer 3 of a uniform thickness d is applied onto a surface 11 of a substrate 1. The surface 31 of the photoresist layer 3 is covered with an exposure mask 4, and this exposure mask comprises an opening 40 through which an exposure field 41 on the surface 31 can be exposed with a defined exposure dose indicated by arrows.

In the next exposure step (FIG. 1b), an exposure mask 4' having a larger opening 40' is employed, and the exposure field 42 of the surface 31, which overlays the exposure field 41, is capable of being exposed with a second defined exposure dose through this larger opening 40'. The result thereof is that the exposure field 41 contained in the exposure field 42 has been exposed twice and, as a consequence, will have a higher dosage than the remaining part of the exposure field 42.

In the next exposure step (FIG. 1c), a mask 4" having an even larger opening 40" is employed. An exposure field 43 on the surface 31 will overlay the two exposure fields 41 and 42 and is capable of being exposed with a defined exposure dose through this even larger opening 40". The results thereof is that the exposure field 41 has been exposed with the highest exposure dose, because it has been exposed three times. The region of the exposure field 42 lying outside of the exposure field 41 is exposed with a lower exposure dose because it has only been exposed twice and the region of the exposure field 43 lying outside of the exposure field 42 has been exposed with an even lower exposure dose because it has only been exposed once. Finally, the region of the surface 31 lying outside the exposure field 43 has not been exposed because it lies under the mask 4'. The resulting step-shaped topical profile of the exposure dose is graphically shown in FIG. 2a. If the photoresist is a positive resist, then with development it will assume the structure graphically shown in FIG. 2b and FIG. 3.

Figure 2A:
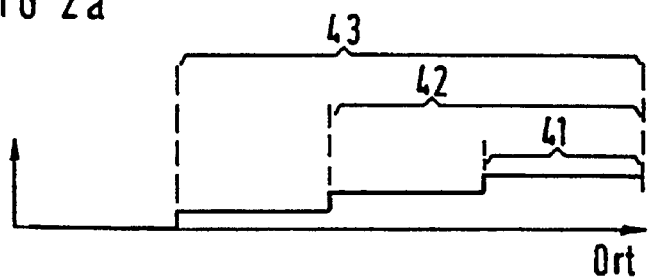
FIG. 2a is a graphical profile showing the amount of exposure obtained in the steps illustrated in FIGS. 1a through 1c.
Figure 2B:
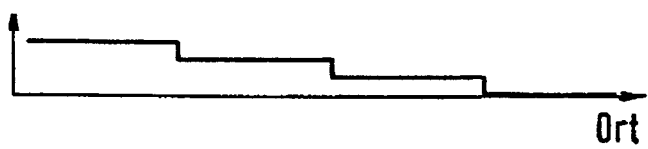
FIG. 2b is a profile of the topically dependent layer thickness of the photoresist resulting after development.
Figure 3:
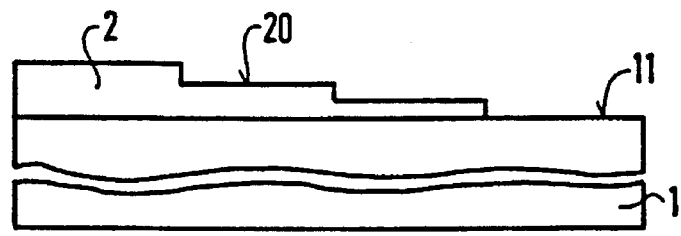
FIG. 3 is a schematic side view of a developed photoresist layer having a surface of a substrate structured according to the profile of FIG. 2b.

After the development of the photoresist, the developed photoresist layer 2 having a step-shaped surface structure 20 of FIG. 3 will occur from the photoresist 3 being exposed in the above-mentioned way, whereby the profile of this structure 20 is the same as indicated in FIG. 2b in conjunction with the profile of the exposure dose of FIG. 2a. In accord therewith, the photoresist is completely removed after development in the most highly exposed exposure field 41, whereas it has fully remained in the region outside of the exposure field 43 in which no exposure occurred. Given employment of a negative-type photoresist, the conditions or structure of the relief would then be reversed.

The exposure doses for the exposure of the individual fields 41, 42 and 43 can be equal to or different from one another. One can always proceed so that, for example, only one mask 4 having an opening 40 is employed, exposing only the exposure field 41 of the surface 31. Then, this mask is shifted after each exposure so that another portion of the surface 31 can be exposed with a field 41 next to the already-exposed field 41, etc. When the layer thicknesses of the developed photoresist are to differ from one another in different exposure fields 41 of this type, exposure doses that are different from one another must be employed for this particular exposure field.

Correspondingly small exposure fields, a plurality of exposure steps and, potentially, exposure doses that are finely adapted to one another must be employed for producing finer, relief surface structures. What essentially acts as a limitation is the step height that is usually prescribed by the exposure dose that is usually conditioned by the apparatus. A wafer stepper is preferably employed for the exposure, since the multiple exposure can be implemented in an extremely simple way and can be precisely controlled with such an apparatus.

For producing continuous, relief-like surface structures, exposure masks must be employed whose transmissivity for the exposure radiation is continuously topically dependent. The relief of the photoresist layer, particularly the form of the thickness profile of the photoresist, can be largely arbitrarily set.

Figure 4:
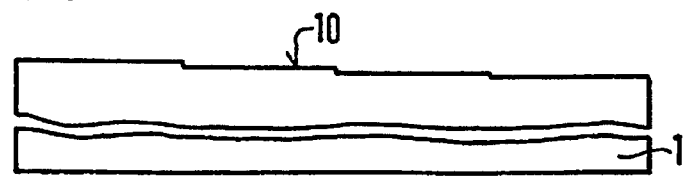
FIG. 4 is a side view of a step-shaped surface structure on the substrate obtained after removal of the photoresist layer of FIG. 3.

The photoresist layer 2 having the relief surface structure 20 is removed with an erosion process that erodes or removes both the photoresist as well as the substrate material that is free of the photoresist or becomes free thereof during the step of erosion. After this removal, the desired relief surface structure 10 of FIG. 4 will occur. The fact that the relief surface structure is essentially identical to the prescribed, relief structure to be produced is intended to mean that two structures can differ from one another insofar as the photoresist can have a different erosion rate or rate of removal than the structure during the erosion or removal process. Such a difference must be taken into consideration in determining the step height in the surface structure of the photoresist layer 2 in comparison to the height in structure 10 (FIG. 4).

Reaching the desired relief surface structure of the photoresist layer can be assured by controlled development, for example on the basis of in situ observation of the resist erosion during the development with an interferometer structure.

A resist layer having a step-like layer-thickness taper was realized with the methods set forth above. The exposure occurs with an exposure unit in the form of a wafer stepper in a colored positive photoresist. FIG. 5 shows the measured, multi-step resist thickness profile of the developed photoresist layer. This photoresist layer was transferred into a InP substrate on which the photoresist layer was applied having been transferred with a reaction ion beam etching method (RIBE dry etching) upon employment of etching gases of $N_2$ and $O_2$. FIG. 6 shows the measured surface profile for such a substrate after this reaction ion beam etching step.

Although various minor modifications may be suggested by those versed in the art, it should be understood that I wish to embody within the scope of the patent granted hereon all such modifications as reasonably and properly come within the scope of my contribution to the art.

I claim:

1. A method for producing a surface relief structure on a substrate, said relief structure being selected from a group of structures on the substrate including a waveguide on the substrate, optical layer thickness tapers on the substrate, a geodetic lens on the substrate, an integrated microlens on the substrate, a Fresnel lens, and a relief surface structure for micromechanics, said method comprising the steps of providing a substrate having a photoresist layer of a uniform thickness, exposing a first field of the photoresist layer with a uniform first exposure dose to form a first exposed field and a first unexposed area, then exposing a second field, which includes the first exposed field and a portion of the first unexposed area, with a uniform second exposure dose to form a second exposed field and a second unexposed area, developing the photoresist to form a developed photoresist layer having at least two areas of different thicknesses to form a relief surface structure corresponding to the surface relief structure to be produced, then forming the surface relief structure by etching with a reactive ion beam etching process to remove the photoresist layer and any surface of the substrate free of the photoresist layer and becoming free of said photoresist layer so that the surface of the substrate has a relief structure in the surface with different depths due to the different thicknesses of the developed photoresist layer.

2. A method according to claim 1, wherein the exposure doses are the same amounts.

3. A method according to claim 1, wherein the exposure doses are different amounts.

4. A method according to claim 1, which includes a step of exposing a third exposure field including the second exposed field and a portion of the second unexposed area so that the developed photoresist has at least three areas of different thicknesses.

5. A method according to claim 1, wherein the step of exposing a first field uses a first mask with a first opening, the step of exposing a second field uses a second mask with a second opening larger than the first opening.

6. A method according to claim 1, wherein the reactive ion beam process utilizes $N_2$ and $O_2$ as etching gases.

7. A method according to claim 1, wherein the step of developing is controlled by observing the amount of the removal of the photoresist layer.

* * * * *